United States Patent

Hunt et al.

[11] Patent Number: 6,122,203
[45] Date of Patent: *Sep. 19, 2000

[54] METHOD, ARCHITECTURE AND CIRCUIT FOR WRITING TO AND READING FROM A MEMORY DURING A SINGLE CYCLE

[75] Inventors: Jeffery Scott Hunt, Ackerman, Miss.; Sudhaker Reddy Anumula, Sunnyvale, Calif.; Ajay Srikrishna, Starkville, Miss.; Jeffrey W. Waldrip, Starkville, Miss.; Satish C. Saripella, Starkville, Miss.

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/107,000

[22] Filed: Jun. 29, 1998

[51] Int. Cl.⁷ .................................................. G11C 7/00

[52] U.S. Cl. ................................ 365/189.05; 365/230.06; 365/230.08; 365/233.5

[58] Field of Search .................... 365/189.05, 230.06, 365/230.08, 194, 233.5

[56] References Cited

U.S. PATENT DOCUMENTS

| | | | |
|---|---|---|---|
| 4,825,416 | 4/1989 | Tam et al. | 365/189.05 |
| 5,058,076 | 10/1991 | Kiuchi | 365/230.08 |
| 5,193,076 | 3/1993 | Houston | 365/233.5 |
| 5,291,447 | 3/1994 | Kodama et al. | 365/190 |
| 5,309,395 | 5/1994 | Dickinson et al. | 365/189.04 |
| 5,325,337 | 6/1994 | Buttar | 365/210 |
| 5,388,075 | 2/1995 | Vinal | 365/189.05 |
| 5,394,361 | 2/1995 | Dickinson | 365/189.04 |
| 5,473,565 | 12/1995 | Kusakari | 365/189.01 |
| 5,473,568 | 12/1995 | Okamura | 365/210 |
| 5,479,374 | 12/1995 | Kobayashi et al. | 365/233.5 |
| 5,502,672 | 3/1996 | Kwon | 365/189.05 |
| 5,502,681 | 3/1996 | Park | 365/210 |
| 5,544,101 | 8/1996 | Houston | 365/189.02 |
| 5,559,752 | 9/1996 | Stephens, Jr. et al. | 365/233 |
| 5,568,073 | 10/1996 | McClure | 327/51 |
| 5,596,539 | 1/1997 | Passow et al. | 365/210 |
| 5,604,705 | 2/1997 | Ackland et al. | 365/205 |
| 5,610,862 | 3/1997 | Teel | 365/189.05 |
| 5,625,595 | 4/1997 | Ikeda | 365/194 |
| 5,631,866 | 5/1997 | Oka et al. | 365/189.05 |
| 5,644,773 | 7/1997 | DiMarco | 395/750 |
| 5,652,724 | 7/1997 | Manning | 365/189.05 |
| 5,659,513 | 8/1997 | Hirose et al. | 365/205 |
| 5,661,417 | 8/1997 | Kondoh | 365/87 |
| 5,661,691 | 8/1997 | Lin | 365/208 |
| 5,666,321 | 9/1997 | Schaefer | 365/233.5 |

(List continued on next page.)

OTHER PUBLICATIONS

Jeffrey S. Hunt et al., U.S.S.N. 09/106,806 Method, Architecture and Circuit for Writing to a Memory, filed Jun. 29, 1998.

Jeffrey S. Hunt et al., U.S.S.N. 09/132,100 Method, Architecture and Circuit for Reducing and/or Eliminating Small Signal Voltage Swing Sensitivity, filed Aug. 10, 1998.

Satish Saripella et al., U.S.S.N. 09/126,832 Wordline Synchronized Reference Voltage Generator, filed Jul. 31, 1998.

Jeffrey S. Hunt et al., U.S.S.N. 09/103,960 Self–Timed Sense Amplifier Evaluation Scheme, filed Jun. 24, 1998.

*Primary Examiner*—David Nelms
*Assistant Examiner*—Gene N. Auduong
*Attorney, Agent, or Firm*—Christopher P. Maiorana, P.C.

[57] ABSTRACT

A circuit and method comprising a memory, a first latch, a second latch and a control circuit. The memory may be configured to write information in response to (i) an input data signal and (ii) an address signal. The first latch may be configured to hold the address in response to a control signal. The second latch may be configured to hold the data input signal in response to the control signal. The control circuit may be configured to present the control signal in response to (i) an enable signal and (ii) a detect signal.

20 Claims, 5 Drawing Sheets

U.S. PATENT DOCUMENTS

| | | | |
|---|---|---|---|
| 5,703,831 | 12/1997 | Sawada | 365/233 |
| 5,717,653 | 2/1998 | Suzuki | 365/233 |
| 5,724,287 | 3/1998 | Takenaka | 365/191 |
| 5,729,503 | 3/1998 | Manning | 365/189.05 |
| 5,742,552 | 4/1998 | Greenberg | 365/210 |
| 5,745,419 | 4/1998 | Brauch | 365/201 |
| 5,748,544 | 5/1998 | Hashimoto | 365/201 |
| 5,751,170 | 5/1998 | Pyeon | 327/57 |
| 5,751,647 | 5/1998 | O'Toole | 365/200 |
| 5,752,270 | 5/1998 | Wada | 711/169 |
| 5,754,481 | 5/1998 | Yabe et al. | 365/189.05 |
| 5,757,718 | 5/1998 | Suzuki | 365/233.5 |
| 5,761,136 | 6/1998 | Park et al. | 365/191 |
| 5,778,440 | 7/1998 | Yiu et al. | 711/154 |
| 5,822,254 | 10/1998 | Koshikawa et al. | 365/189.05 |
| 5,896,319 | 4/1999 | Takehana | 365/185.29 |
| 5,986,970 | 11/1999 | Hunt et al. | 365/233.5 |

METHOD, ARCHITECTURE AND CIRCUIT FOR WRITING TO AND READING FROM A MEMORY DURING A SINGLE CYCLE

FIELD OF THE INVENTION

The present invention relates to memories generally and, more particularly, to a method, architecture and circuit for writing to and reading from a memory during a single cycle.

BACKGROUND OF THE INVENTION

A conventional approach to writing to a memory responds to each data change when writing to the memory array. Pulsed wordline approaches reduce current significantly when writing and reading from memories. If the data is written to the memory array, and then changes state, the new data is written. Each time the data changes it is written to the memory array. For each data change, current is consumed to perform the write operation. Therefore, all data changes previous to the final data change consume unnecessary current. This causes the current consumption to be unpredictable during a write cycle.

Referring to FIG. 1, a circuit 10 is shown implementing a conventional pulsed wordline approach for writing to a memory. The circuit 10 generally comprises an address path block 12, a memory array block 14, a sense amplifier block 16, and output path block 18, a write driver block 20, a data transition detect block 22, an address transition detect block 24 and a control block 26. The address path block 12 and the address transition detect block 24 each receive a signal ADDRESS that is an externally generated address presented to the circuit 10. The address path block 12 presents a wordline signal WL to the memory array block 14. The memory array block 14 presents a signal TBUS to the sense amplifier block 16. The sense amplifier block 16 presents a signal SAOUT to the output path block 18. The output path block 18 presents a signal IO that may be presented to the external pins of the circuit 10. The signal IO is also presented to the write driver block 20 and the data transition detect block 22. The write driver block 20 presents data to the memory array block 14 and the sense amplifier block 16 receives data from the memory array block 14. The data transition detect block 22 presents a data transition detect signal DTD to the control block 26. The address transition detect block 24 presents an address transition detect signal ATD to the control block 26. The control block 26 also receives an external write enable signal WEB. The control block 26 also receives a signal WLDET from the memory array block 14. The control block 26 presents a signal WLEN to the address path block 12 and a signal SAEN to the sense amplifier block 16.

Referring to FIG. 2, a timing diagram illustrating the various signals of FIG. 1 is shown. The signal ADDRESS has a transition 30. The signal ATD has a positive transition 32 that responds to the transition 30 of the signal ADDRESS. The signal WEB has a transition 34 that begins the write cycle. The signal WLEN has a transition 36 that responds to the transition 34 of the signal WEB. The signal WL has a positive transition 38 that responds to the positive transition 36 of the signal WLEN. The signal WLDET has a positive transition 40 that responds to the positive transition 38 of the signal WL. The signal TBUS has a transition 42 that responds to the positive transition 40 of the signal WLDET. The signal IO has a transition 44 that responds to the negative transition 34 of the signal WEB. The period between transition 44 and 45 of the signal IO is an output tri-state time. The outputs are tri-stated so that external data can be presented on the signal IO. During the tri-state time the value of the data is uncertain. The signal DTD has a positive transition 46 that responds to the transition 44 of the signal IO. The signal IO also has a transition 45 and a transition 48. The transition 48 indicates that stable data is ready to be written to the memory array block 14. Prior to the transition 45, the signals DTD, WLEN, WL, WLDET and TBUS have uncertain states 50a–50e that represent invalid data written to the memory array block 14. Once a stable data transition 45 occurs, the signal WLDET ends the uncertain state 50d at a transition 52. The signal WLEN has a negative transition 54 that responds to the transition 52 of the signal WLDET. The signal WL has a negative transition 56 that responds to the negative transition 54 of the signal WLEN. The signal WLDET has a negative transition 58 that responds to the negative transition 56 of the signal WL. The signal TBUS has a transition 60 that responds to the negative transition 58 of the signal WLDET. The signal DTD has a positive transition 62 that responds to the transition 48 of the signal IO. The positive transition 62 of the signal DTD activates a series of transitions 36', 38', 40', 42', 54', 56', 58' and 60' which causes valid data to be written to the memory array block 14. The invalid data changes consume additional current, which is undesirable in low current applications.

The signal ADDRESS has a transition 63. The signal ATD has a transition 64 that responds to the transition 63 of the signal ADDRESS. The transition 65 of the signal WEB indicates that the circuit 10 has entered read mode. The signal ATD has a negative transition 66 that occurs after a predetermined time from the positive transition 64 of the signal ATD. The signal WLEN has a positive transition 68 that responds to the negative transition 66 of the signal ATD. The signal WL has a positive transition 70 that responds to the positive transition 68 of the signal WLEN. The signal WLDET has a positive transition 72 that responds to the positive transition 70 of the signal WL. The signal TBUS has a transition 71 that responds to the positive transition 70 of the signal WL. The signal SAEN has a positive transition 74 that responds to the positive transition 72 of the signal WLDET. The signal SAOUT has a transition 76 that responds to the positive transition of the signal SAEN. The signal IO has a transition 88 that responds to the transition 76 of the signal SAOUT, which indicates that data is read from the memory array block 14. The signal SAEN has a negative transition 78 that occurs a predetermined time after the positive transition 74 of the signal SAEN. The signal SAOUT has a transition 80 that responds to the negative transition 78 of the signal SAEN. The signal WLEN has a negative transition 82 that responds to the negative transition 78 of the signal SAEN. The signal WL has a negative transition 84 that responds to the negative transition 82 of the signal WLEN. The signal WLDET has a negative transition 86 that responds to the negative transition 84 of the signal WL. The transitions 63–88 generally represent the read operation of the circuit 10 and the transitions 30–62 generally represent the write operations of the circuit 10.

SUMMARY OF THE INVENTION

The present invention concerns a circuit and method comprising a memory, a first latch, a second latch and a control circuit. The memory may be configured to write information in response to (i) an input data signal and (ii) an address signal. The first latch may be configured to hold the address in response to a control signal. The second latch may be configured to hold the data input signal in response to the control signal. The control circuit may be configured to present the control signal in response to (i) an enable signal and (ii) a detect signal.

The objects, features and advantages of the present invention include providing a circuit that may delay writing to a memory array to (i) avoid unnecessary repetitive writings to the memory array, (ii) reduce the overall current used by the circuit and (iii) write to and read from the memory array in a single cycle.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
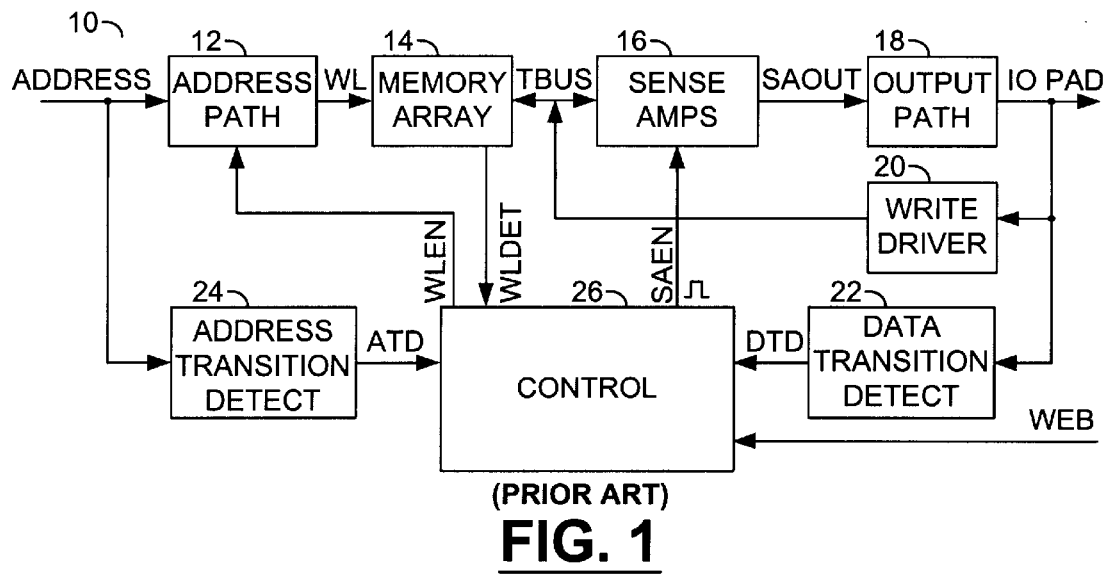
FIG. 1 is a block diagram of a conventional pulsed wordline approach to writing to a memory.
Figure 2:
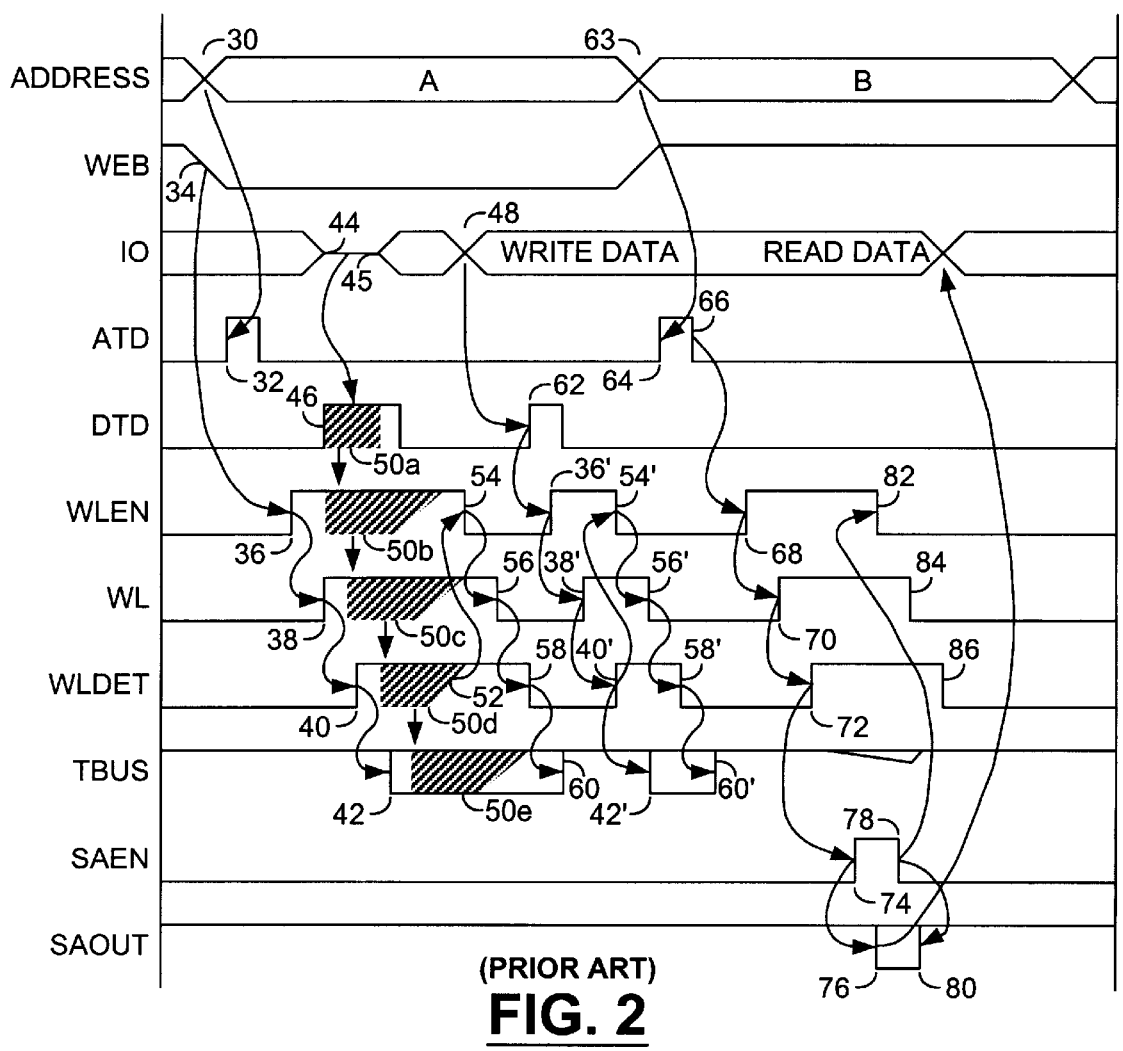
FIG. 2 is a timing diagram of the various signals of FIG. 1.
Figure 3:
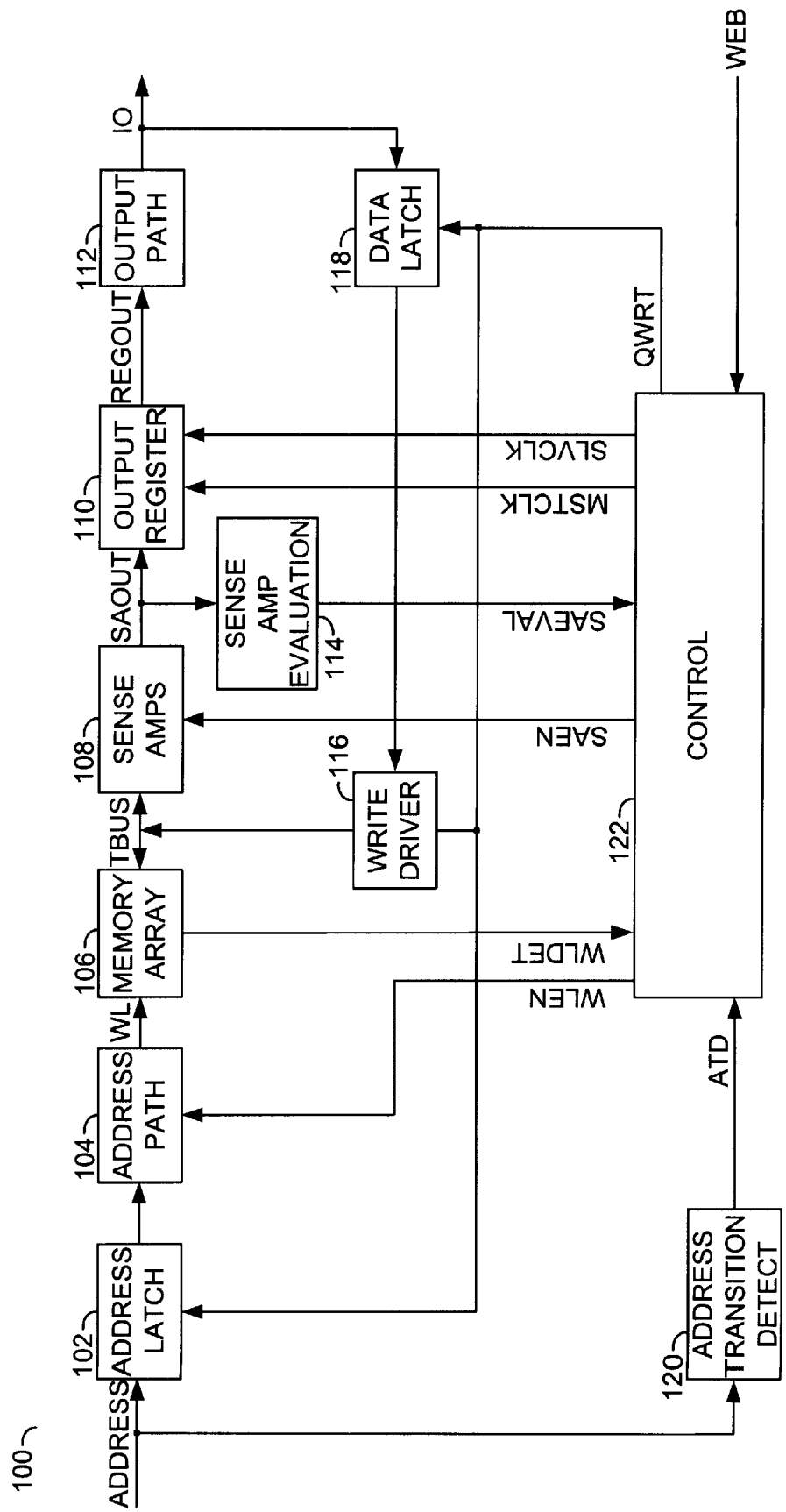
FIG. 3 is a block diagram of the preferred embodiment of the present invention.

Referring to FIG. 3, a block diagram of a circuit 100 is shown in accordance with a preferred embodiment of the present invention. The circuit 100 generally comprises an address latch block (or circuit) 102. An address path block (or circuit) 104, a memory array block (or circuit) 106, a sense amplifier block (or circuit) 108, an output register block (or circuit) 110, an output path block (or circuit) 112, a sense amplifier evaluation block (or circuit) 114, a write driver block (or circuit) 116, a data latch block 118, an address transition detect block (or circuit) 120 and a control block (or circuit) 122.

The address latch block 102 and the address transition detect block 120 may receive a signal (e.g., ADDRESS) that may be an externally generated address signal. The address latch block 102 may hold the previous state of the signal ADDRESS for an amount of time determined by the control block 102 before presenting the new state of the signal ADDRESS to the address path block 104. The address path block 104 may present a signal WL to the memory array block 106. The memory array block 106 may present a signal (e.g., TBUS) to the sense amplifier block 108. The sense amplifier block 108 may present a signal (e.g., SAOUT) to the output register block 110 and the sense amplifier evaluation block 114. The output register block 110 may present a signal (e.g., REGOUT) to the output path block 112. The output path block 112 may present a signal (e.g., IO) to the data latch block 118 as well as to circuitry external to the circuit 100. The data latch block 118 may hold the signal IO in response to a control signal (e.g., QWRT) that may be generated by the control block 112 before presenting the signal IO to the write driver block 116. The write driver block 116 may present the signal IO to the memory array block 106 to write data and the sense amplifier block 108 may read data from the memory array block 106. The address detection block 120 presents an address transition signal (e.g., ATD) to the control block 122. The sense amplifier evaluation block 114 may present a signal (e.g., SAEVAL) to the control block 122. The control block 122 may also receive an external write enable signal (e.g., WEB). An example of the sense amplifier evaluation block 114 may be found in co-pending application, attorney docket number 0325.00177, filed on Jun. 23, 1998, which is hereby incorporated by reference in its entirety.

The memory array block 106 may present a signal (e.g., WLDET) to the control block 122. The control block 122 presents the control signal QWRT to the data latch block 118, to the address latch block 102 and to the write driver block 116. The control block 122 may also present an enable signal (e.g., SAEN) to the sense amplifier block 108 and a control signal (e.g., MSTCLK) and a control signal (e.g., SLVCLK) to the output register block 110. An example of the generation of the signals MSTCLK and SLVCLK may be found in co-pending application, attorney docket number 0325.00175, filed on Jun. 25, 1998, which is hereby incorporated by reference in its entirety.

Figure 4:
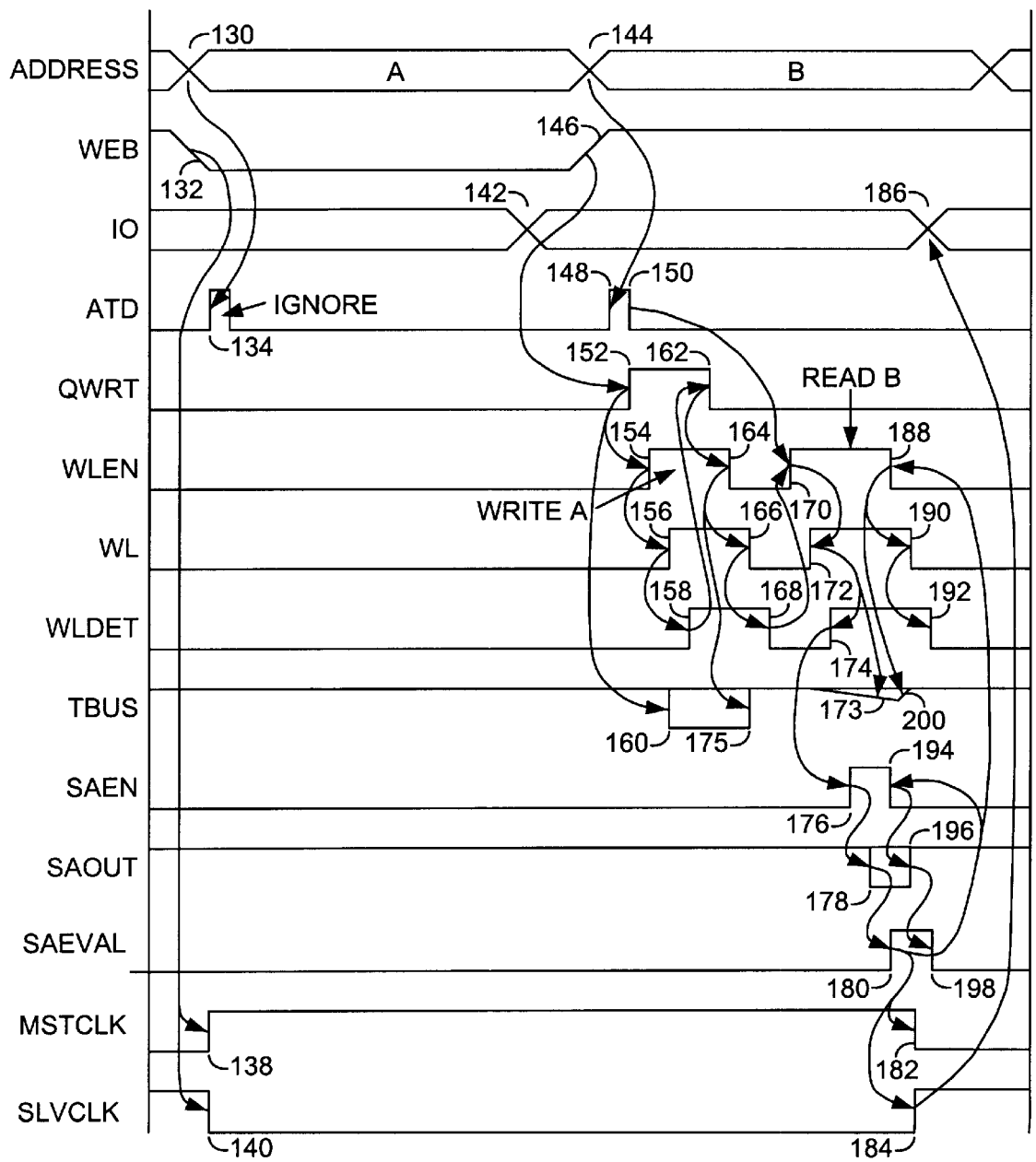
FIG. 4 is a timing diagram of the various signals of FIG. 3.

Referring to FIG. 4, a timing diagram of the various signals of FIG. 3 is shown. The signal ADDRESS may have a transition 130. The signal WEB may have a transition 132 that may indicate the beginning of a write cycle. The signal ATD may have a positive transition 134 that generally responds to the transition 130 of the signal ADDRESS. The signal MSTCLK may have a positive transition 138 that generally responds to the transition 132 of the signal WEB. The signal SLVCLK may have a negative transition 140 that generally responds to the transition 132 of the signal WEB. Since the positive transition 134 of the signal ATD occurs at the beginning of a write, the internal write (to be described in connection with FIG. 5) is not generally asserted. Hence, a write operation is not performed and the signals WLEN, WL, WLDET and TBUS will not change, which generally saves the overall current used by the circuit 100.

The signal IO may have a transition 142. The signal ADDRESS may have a transition 144, and the signal WEB may have a transition 146 that may end the write operation. The transition 142 may represent a change in data that should be written to the memory array block 106. The signal ATD may have a positive transition 148 that generally responds to the transition 144 of the signal ADDRESS. The signal ATD may also have a negative transition 150. The signal QWRT may have a positive transition 152 that generally responds to the transition 146 of the signal WEB. The signal WLEN may have a positive transition 154 that may respond to the positive transition 152 of the signal QWRT. The signal WL may have a positive transition 156 that may respond to the positive transition 154 of the signal WLEN. The signal WLDET may have a positive transition 158 that generally responds to the positive transition 156 of the signal WL. The signal TBUS generally has a transition 160 that generally responds to the positive transition 152 of the signal QWRT. The signal QWRT may have a negative transition 162 that generally responds to the positive transition 158 of the signal WLDET. The signal WLEN may have a negative transition 164 that may respond to the negative transition 162 of the signal QWRT. The signal WL may have a negative transition 166 that generally responds to the negative transition 164 of the signal WLEN. The signal WLDET may have a negative transition 168 that generally responds to the negative transition 166 of the signal WL. The transitions 152, 154, 156, 158, 160, 162, 164, 166 and 168 generally represent the operation of the various signals when writing to the memory array block 106.

Following the write operation, a read operation may occur when the signal WLEN may have a positive transition 170 that may respond to the negative transition 168 of the signal WLDET. More specifically, the address and data values previous to the address transition 144 may be stored in the address latch block 102 and the data latch block 118 until the write operation is complete. Once the write operation has completed, designated by the negative transition 162 of the signal QWRT, the read operation is generally initiated. Therefore, a read operation may occur during the same cycle as a write operation even though the transition 144 of the signal ADDRESS may have already occurred.

The signal WL may have a positive transition 172 that generally responds to the positive transition 170 of the signal WLEN. The signal TBUS may have a transition 175 that generally responds to the negative transition 164 of the signal WLEN. The signal WLDET may have a positive transition 174 that generally responds to the positive transition 172 of the signal WL. The signal SAEN may have a positive transition 176 that may respond to the positive transition 174 of the signal WLDET. The signal SAOUT may have a transition 178 that may respond to the positive transition 176 of the signal SAEN. The signal SAEVAL may have a positive transition 180 that generally responds to the transition 178 of the signal SAOUT. The signal MSTCLK may have a negative transition 182 that generally responds to the positive transition 180 of the signal SAEVAL. The signal SLVCLK may have a positive transition 184 that generally responds to the positive transition 180 of the signal SAEVAL. The signal IO may have a transition 186 that generally responds to the positive transition 184 of the signal SLVCLK. The signal WLEN may have a negative transition 188 that generally responds to the positive transition 180 of the signal SAEVAL. The signal WL may have a negative transition 190 that generally responds to the negative transition 188 of the signal WLEN. The signal WLDET may have a negative transition 192 that generally responds to the negative transition 190 of the signal WL. The signal SAEN may have a negative transition 194 that may respond to the positive transition 180 of the signal SAEVAL. The signal SAOUT may have a transition 196 that generally responds to the negative transition 194 of the signal SAEN. The signal SAEVAL may have a negative transition 198 that generally responds to the transition 196 of the signal SAOUT. The signal TBUS has a transition 200 that generally responds to the negative transition 188 of the signal WLEN.

In general, the transitions 146–168 represent a write operation to the memory array block 106. The transitions 170–200 (along with the transition 144 of the signal ADDRESS) generally represent a read from the memory array block 106. Since the write operation is generally initiated when the signal WEB transitions high, the data transitions are generally ignored while WEB is low, which may eliminate unnecessary current consumption. Therefore, only one write operation is generally performed allowing predictable current consumption during write.

Figure 5:
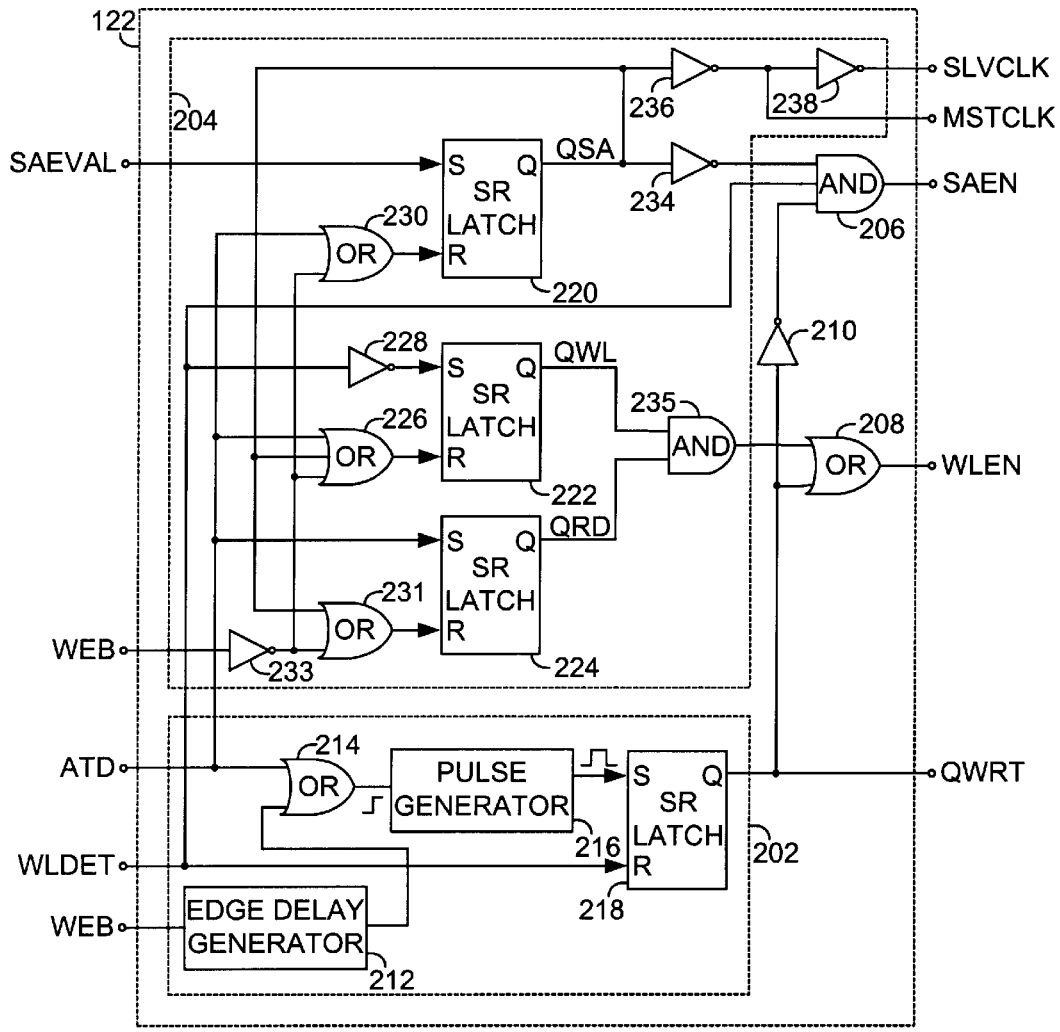
FIG. 5 is a block diagram of the control block of FIG. 3.

Referring to FIG. 5, a more detailed diagram of the control block 122 is shown. The control block 122 generally comprises a write portion 202, a read portion 204, a logic gate 206, a logic gate 208, and an inverter 210. In one example, the logic gate 206 may be implemented as an AND gate and the logic gate 208 may be implemented as an OR gate. The write portion 202 generally comprises an edge delay generator 212, a logic gate 214, a pulse generator 216 and a latch 218. In one example, the logic gate 214 may be implemented as an OR gate. The latch 218 may be implemented, in one example, as a set-reset latch. The delay generator 212 generally receives the signal WEB and presents a signal to one input of the OR gate 214. The OR gate 214 may also receive the signal ATD at another input. The OR gate 214 may present a signal to the pulse generator 216. The pulse generator 216 may present a pulse to the set input of the latch 218. The latch 218 may present the control signal QWRT.

The read section 204 generally comprises a latch 220, a latch 222, a latch 224, a gate 226, an inverter 228, a gate 230, a gate 231, an inverter 233, an inverter 234, a logic gate 235, an inverter 236 and an inverter 238. The latches 220, 222 and 224 may be implemented, in one example, as set-reset latches. The latch 220 may have a set input that may receive the signal SAEVAL and a reset input that may receive a signal from the gate 230. The latch 220 may present an output signal (e.g., QSA). The gate 226, the gate 230 and the gate 231 may be implemented, in one example, as OR gates. The gate 235 may be implemented, in one example, as an AND gate. The gate 230 has one input that may receive the signal WEB, through the inverter 233, and another input that may receive the signal ATD. The latch 222 may have a set input that may receive the signal WLDET, through the inverter 228, and a reset input that may receive a signal from the gate 226. The gate 226 has one input that may receive the signal ATD, another input that may receive the signal QSA from the latch 220, and a third input that may receive the signal WEB through the inverter 233. The latch 222 may present an output signal (e.g., QWL). The latch 224 has a set input that may receive the signal ATD and a reset input that may receive a signal from the gate 231. The gate 231 has one input that may receive the signal QSA from the latch 220 and another input that may receive the signal WEB, through the inverter 233. The latch 224 may present an output signal (e.g., QRD). The gate 206 may receive the signal QSA from the latch 220, through the inverter 234. The gate 206 may have another input that may receive the signal WLDET and a third input that may receive the signal from the output of the latch 218, through the inverter 210. The output of the latch 218 may also be presented to the gate 208. The gate 235 has one input that may receive the signal QWL and another input that may receive the signal QRD. The gate 235 may present a signal to the gate 208.

Figure 6:
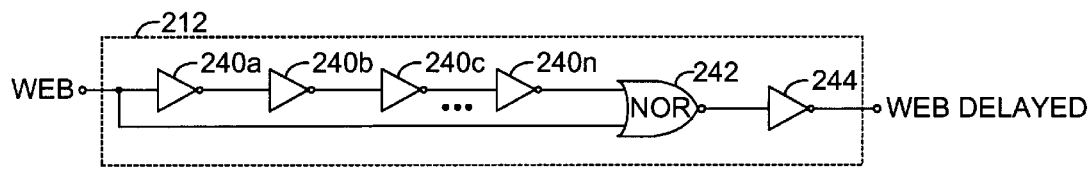
FIG. 6 is a circuit diagram of the edge delay generator is of FIG. 3.

Referring to FIG. 6, a circuit diagram of the edge delay generator 212 is shown. The edge delay generator 212 generally comprises a number of inverters 240a–240n, a gate 242 and an inverter 244. The edge delay generator 212 generally presents a delayed version of the negative transition of the signal WEB (e.g., WEB_DELAY) in response to the signal WEB. The number of inverters 240a–240n generally determines the amount of delay presented by the edge delay generator 212.

Figure 7:
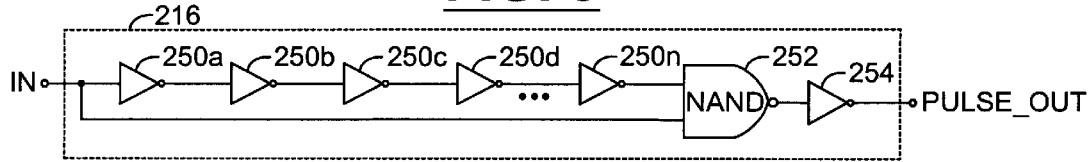
FIG. 7 is a circuit diagram of the pulse generator of FIG. 3.

Referring to FIG. 7, a circuit diagram of the pulse generator 216 is shown. The pulse generator 216 generally comprises a number of inverters 250a–250n, a gate 252 and an inverter 254. The gate 252 may be implemented, and in one example, as a NAND gate. The pulse generator 216 generally presents a signal (e.g., PULSE_OUT) in response to the signal (e.g., IN) received from the OR gate 214.

Figure 8:
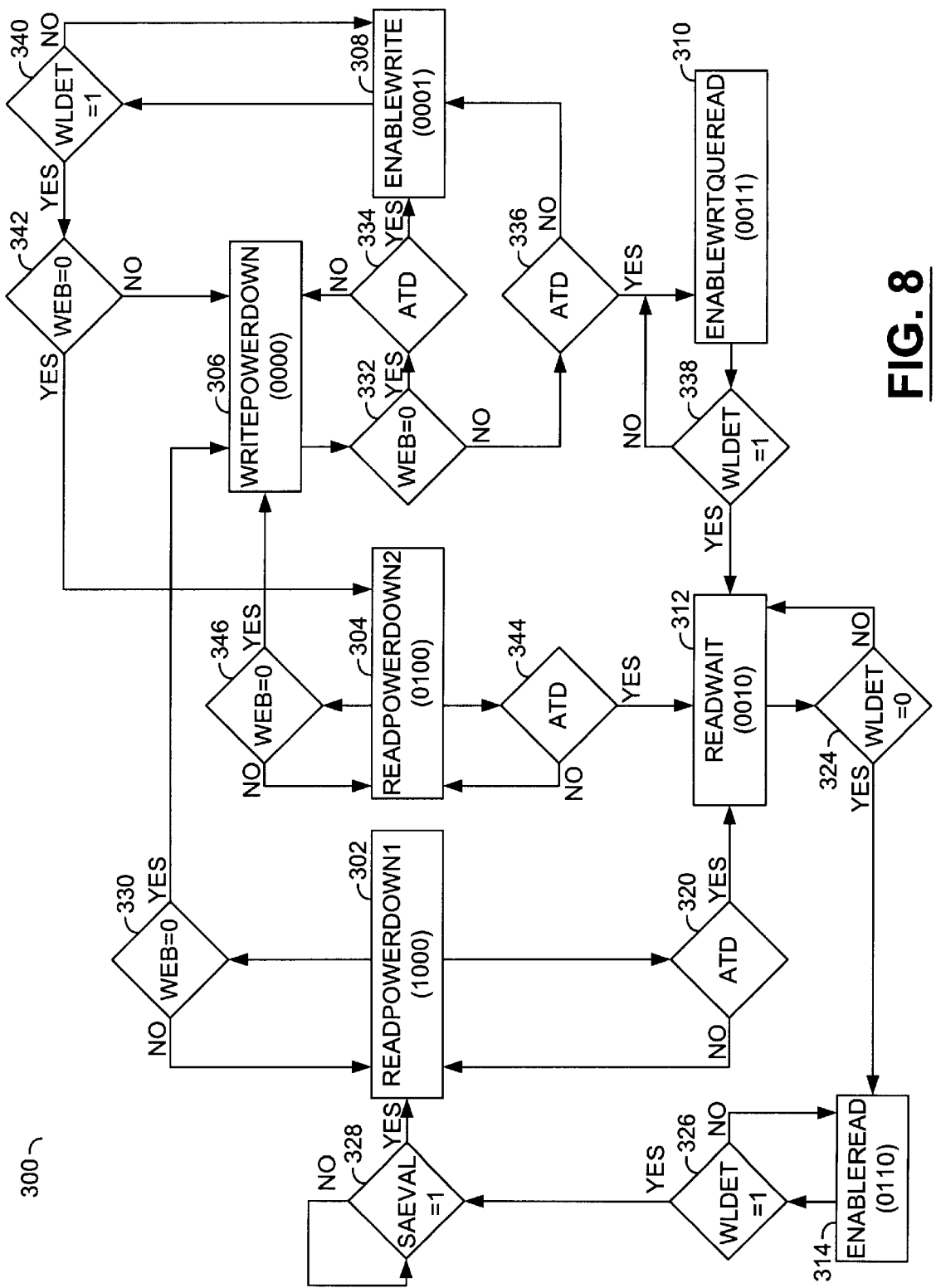
FIG. 8 is a flow diagram illustrating the operation of the control block of the circuit of FIG. 5.

Referring to FIG. 8, a flow diagram illustrating the functioning of the circuit of FIG. 5 is shown. The flow diagram 300 generally comprises a state 302 (e.g., READPOWERDOWN1), a state 304 (e.g., READPOWERDOWN2), a state 306 (e.g., WRITEPOWERDOWN), a state 308 (e.g., ENABLEWRITE), a state 310 (e.g., ENABLEWRITEQUEREAD), a state 312 (e.g., READWAIT) and a state 314 (e.g., ENABLEREAD). Each of the states 302–314 has a multi-bit word that represents the output of the latches 218–224. The first bit generally represents the output of the latch 220, the second bit generally represents the output of the latch 222, the third bit generally represents the output of the latch 224, and the fourth bit generally represents the output of the latch 218. More specifically, when in the state 302, the multi-bit word (e.g., 1000) generally indicates that the latch 220 is presenting a digital "1" and the latches 222, 224 and 218 are each presenting a digital "0".

When in the state 302, the logic 300 generally waits for an address transition, generally represented by the block 320. If an address transition detect does not occur, the logic 300 stays in the state 302. If an address transition detect does occur, the logic proceeds to the state 312. When in the state 312, the logic 300 evaluates the state of the signal WLDET, as represented by the block 324. If the signal WLDET does not equal "0", the logic generally returns to the state 312. If the signal WLDET equals "0", the logic enters the state 314. After entering the state 314, the logic searches for a "1" on the signal WLDET, as represented by the block 326. If a "1" is not found, the logic generally returns to the state 314. If a "1" is found, the logic generally searches for the signal SAEVAL equal to a "1", as represented by the block 328. If the signal SAEVAL is not equal to "1", the logic 300 continues to wait at the block 328. If the signal SAEVAL is equal to "1", the logic 300 generally returns to the state 302. While in the state 302, the logic also searches for the signal WEB to be equal to a "0" represented by the block 330. If the signal WEB is not equal to a "0", the logic generally returns to the state 302. If the signal WEB is equal to a "0", the logic generally enters the state 306. After the state 306, the logic generally searches for the signal WEB to be equal to a "0", as defined by the block 332. If the signal WEB is equal to "0", the logic 300 generally searches for an address transition detect as defined by the block 334. If an address transition is not detected, the logic 300 generally returns to the state 306. If an address transition is detected, the logic generally enters the state 308. During the block 332, if the signal WEB is not equal to a "0", the logic 300 will still search for an address transition detect signal that is defined by the block 336. If an address transition detect is not found, the logic 300 enters the state 308. If the address transition is detected at the block 336, the logic 300 enters the state 310. When in the state 310, the logic searches for the signal WLDET to be equal to a "1". If the signal WLDET is equal to a "1", the logic enters the state 312. If the signal WLDET is not equal to a "1", the logic generally enters the state 310.

When in the state 308, the logic 300 searches for the signal WLDET to be equal to a "1", as shown in the block 340. If the signal WLDET is not equal to a "1", the logic stays in the state 308. If the signal WLDET is equal to a "1", the logic then searches for the signal WEB to be equal to a "0", as shown in the block 342. If the signal WEB is equal to "0", the logic continues to the block 306. If the signal WEB is not equal to a "0", the logic 300 then moves to state 304. When in the state 304, the logic searches for an address transition detect, as shown by the block 344 as well as the signal WEB equal to a "0", as shown in the block 346. If the address transition is detected, the logic enters the state 312. If the address transition is not detected, the logic remains in the state 304. If the signal WEB is equal to "0", the logic enters the state 306. If the signal WEB is not equal to "0", the logic remains in the state 304.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a memory configured to write information in response to an input data signal and an address signal;
   a first latch circuit configured to hold said address signal for a predetermined time in response to a control signal;
   a second latch circuit configured to hold said input data signal for a predetermined time in response to said control signal; and
   a control circuit configured to present said control signal in response to an enable signal and a detect signal, wherein said detect signal indicates that a voltage is detected on a wordline.

2. The circuit according to claim 1, wherein said enable signal comprises a write enable signal.

3. The circuit according to claim 1, wherein said detect signal comprises a wordline detect signal.

4. The circuit according to claim 1, wherein said control circuit comprises a third latch configured to generate said control signal.

5. The circuit according to claim 4, wherein said third latch generates said control signal in response to said enable signal.

6. The circuit according to claim 1, wherein said control signal has a first state that enables said first latch to hold said address signal and said second latch to hold said input data signal and a second state that enables said first latch to present said address signal and said second latch to present said data signal.

7. The circuit according to claim 1, further comprising a write driver circuit configured to write said information to said memory in response to said control signal.

8. The circuit according to claim 1, wherein said memory is configured to read information in response to said control signal.

9. The circuit according to claim 8, wherein said memory writes information and reads information during a single cycle.

10. A method for writing to a memory comprising the steps of:
    (A) writing information in response to an input data signal and an address signal;
    (B) holding said address signal for a predetermined time in response to a control signal;
    (C) holding said input data signal for a predetermined time in response to said control signal; and
    (D) presenting said first control signal in response to (i) an enable signal and a detect signal, wherein said detect signal indicates that a voltage is detected on a wordline.

11. The method according to claim 9, wherein said detect signal comprises a wordline detect signal.

12. The method according to claim 9, wherein said step (B) generates said control signal in response to a third latch.

13. The method according to claim 9, wherein said step (B) generates said control signal in response to said enable signal.

14. The method according to claim 10, wherein said control signal has a first state that enables step (B) to hold said address signal and step (C) to hold said data signal and a second state that enables step (B) to present said address signal and said step (C) to present said data signal.

15. The method according to claim 9, wherein said enable signal comprises a write enable signal.

16. The method according to claim 10, further comprising the step of:
    reading information in response to said control signal.

17. The method according to claim 16, wherein said writing and reading occurs during a single cycle.

18. A circuit comprising:

means for writing information in response to an input data signal and an address signal;

means for holding said address signal for a predetermined time in response to a control signal;

means for holding said data input signal for a predetermined time in response to said control signal; and means for presenting said first control signal in response to an enable signal and a detect signal, wherein said detect signal indicates that a voltage is detected on a wordline.

19. The circuit according to claim 18, wherein said circuit further comprises:

means for reading information in response to said control signal.

20. The circuit according to claim 19, wherein said circuit writes information and reads information during a single cycle.

* * * * *